United States Patent [19]
Doi et al.

[11] Patent Number: 6,030,741
[45] Date of Patent: Feb. 29, 2000

[54] POSITIVE RESIST COMPOSITION

[75] Inventors: Kousuke Doi; Takako Suzuki; Hidekatsu Kohara; Toshimasa Nakayama, all of Kanagawa, Japan

[73] Assignee: Tokyo Ohka Kogyo Co., Ltd., Kanagawa, Japan

[21] Appl. No.: 08/919,368

[22] Filed: Aug. 28, 1997

[30] Foreign Application Priority Data

Aug. 29, 1996 [JP] Japan ................................ 8-245440

[51] Int. Cl.⁷ .................................................. G03F 7/023
[52] U.S. Cl. ........................ 430/191; 430/192; 430/193
[58] Field of Search .................................. 430/191, 192, 430/193

[56] References Cited

U.S. PATENT DOCUMENTS

| | | | |
|---|---|---|---|
| 4,526,856 | 7/1985 | Lewis et al. | 430/191 |
| 4,550,069 | 10/1985 | Pampalone | 430/165 |
| 5,100,758 | 3/1992 | Tanaka et al. | 430/191 |
| 5,215,857 | 6/1993 | Hosaka et al. | 430/191 |
| 5,238,774 | 8/1993 | Hosaka et al. | 430/191 |
| 5,336,583 | 8/1994 | Uetani et al. | 430/191 |
| 5,405,720 | 4/1995 | Hosaka et al. | 430/191 |
| 5,407,779 | 4/1995 | Uetani et al. | 430/192 |
| 5,429,904 | 7/1995 | Nagase et al. | 430/192 |
| 5,434,031 | 7/1995 | Nakao et al. | 430/191 |
| 5,468,590 | 11/1995 | Hashimoto et al. | 430/192 |
| 5,702,862 | 12/1997 | Ohno et al. | 430/192 |
| 5,728,504 | 3/1998 | Hosoda et al. | 430/192 |
| 5,759,736 | 6/1998 | Nishi et al. | 430/192 |
| 5,849,457 | 12/1998 | Namba et al. | 430/191 |

OTHER PUBLICATIONS

Derwent Abstract of JP–A–59–155838 (Sep. 5, 1984).
Derwent Abstract of JP–A–4–362645 (Dec. 15, 1992).
Derwent Abstract of JP–A–2–247653 (Oct. 3, 1990).

*Primary Examiner*—John S. Chu
*Attorney, Agent, or Firm*—Sughrue, Mion, Zinn Macpeak & Seas, PLLC

[57] ABSTRACT

The present invention provides a positive resist composition and method capable of achieving a resist pattern whose photosensitivity is less variable relative to its thickness, which exhibits small thickness reduction even when the pattern is fine, is capable of coping with irregularities in the exposure value since it has a wide focal-depth range, and exhibits reduced size-deviation from the mask size. The positive resist composition comprises (A) an alkali-soluble resin, (B) a quinonediazide-group-containing compound, and (C) an organic solvent, wherein the ingredient (C) is a mixture solvent containing (i) 2-heptanone, (ii) ethyl lactate, and (iii) a high-boiling organic solvent having a boiling point of 200 to 350° C. The above-described resist pattern can be formed by using the positive resist composition.

2 Claims, 1 Drawing Sheet

POSITIVE RESIST COMPOSITION

BACKGROUND OF THE INVENTION

1. Field of the Invention

The present invention relates to positive resist compositions. More specifically, it relates to a positive resist composition which is useful for forming fine patterns in the field of manufacturing electronic parts such as semiconductor devices and liquid-crystal display devices, and which can achieve a resist pattern exhibiting photosensitivity less variable relative to its thickness, superior shape-profiling ability, small thickness reduction even when the pattern is fine, especially when the pattern width is 0.35 μm or less, ability to cope with irregularities in the exposure value since it has a wide focal-depth range, and reduced size-deviation from the mask size.

2. Description of the Related Art

Hitherto, in the manufacture of electronic parts such as semiconductor devices and liquid-crystal display devices, photolithography has been employed as a pattern-transferring process to form a pattern on a substrate. In the photolithographic process, a resist is applied onto a substrate such as a silicon wafer or a glass sheet using a spinner or the like and then dried, subsequently, the resultant is irradiated with an active light beam through a mask and then developed to transfer the mask pattern onto the substrate, and etching is performed. In the early manufacture of electronic parts as listed above, negative photoresists were used in combination with contact exposure to form etching masks for such pattern-transferring processes. Negative photoresists have, however, limited resolution due to swelling during development, and contact exposure damages the masks. Due to such drawbacks, the combination of a positive photoresist and reductive projection exposure, which exhibits superior definition, is employed instead of the aforementioned combination.

In general, a resist composition comprising an alkali-soluble resin and a quinonediazide-group-containing photosensitive compound dissolved in a solvent is used as the above-described positive photoresist. Such quinonediazide-group-containing compounds are, however, less soluble in conventional solvents. Due to this, the application of such a resist composition to a silicon wafer or a glass substrate is accompanied by coating irregularities, and therefore, a uniform coating film can rarely be obtained.

In view of such drawbacks, a large number of solvents for positive photoresists have been developed recently. The following are examples of such solvents:

Cyclopentanone (Japanese Patent Laid-Open No. 59-155838);

Monooxymonocarboxylates (Japanese Patent Laid-Open No. 62-123444);

Mixture solvents of cyclic ketones and alcohols (the specification of U.S. Pat. No. 4,526,856);

Propylene glycol monoalkyl ether acetates (Japanese Patent Laid-Open No. 61-7837);

Mixture solvents of organic solvents having vaporizing rates of 1 to 24 and organic solvents having vaporizing rates of 25 to 150, such as the mixture solvent of γ-butyrolactone and 2-heptanone, wherein the vaporizing rates are measured according to a weighing method assuming the vaporizing rate of n-butyl acetate as 100 (Japanese Patent Laid-Open No. 4-362645);

Specific keto-ether solvents having boiling points of 130 to 170° C., such as 4-methoxy-4-methyl-2-pentanone (Japanese Patent Laid-Open No. 2-247653);

Ethyl pyruvate (Japanese Patent Laid-Open No. 4-362646); and

Mixture solvents comprising specific combinations of ethyl lactate, n-amyl acetate and 2-heptanone (Japanese Patent Laid-Open No. 5-34918).

The above-listed solvents are, however, still unsatisfactory as positive resist compositions used in the manufacture of electronic parts which have been more finely processed, since a resist pattern formed using a positive resist solution prepared with such a solvent has photosensitivity readily variable relative to its thickness, exhibits marked thickness reduction when the pattern is fine, cannot cope with irregularities in the exposure value due to its narrow focal-depth range, and is rarely faithful to the mask size. Accordingly, there is a strong demand for the development of a more practical solvent for positive resists.

SUMMARY OF THE INVENTION

In view of the above-described view points, the Inventors earnestly conducted several investigations, and found that the above-described problems can be solved by using as a solvent for resists a mixture solvent containing 2-heptanone, ethyl lactate and an organic solvent having a high boiling point of 200 to 350° C., thus accomplishing the present invention.

Accordingly, an object of the present invention is to provide a positive resist composition achieving a resist pattern exhibiting photosensitivity less variable relative to its thickness, small thickness reduction even when the pattern is fine lines, and ability to cope with irregularities in the exposure value since it has a wide focal-depth range, exhibits reduced size-deviation from the mask size, and has a superior shape-profiling ability.

In addition, another object of the present invention is to provide a method for forming a positive resist pattern which exhibits small thickness reduction when the pattern width is 0.35 μm or less, is capable of coping with irregularities in the exposure value since it has a wide focal-depth range, and exhibits reduced size-deviation from the mask size.

To achieve the aforementioned objects, according to the present invention, there is provided a positive resist composition comprising:

(A) an alkali-soluble resin;

(B) a quinonediazide-group-containing compound; and (C) an organic solvent, wherein said organic solvent is a mixture solvent containing:
  (i) 2-heptanone;
  (ii) ethyl lactate; and
  (iii) a high-boiling solvent having a boiling point of 200 to 350° C.

Further, the present invention provides the positive resist composition wherein said ingredient (C) is a mixture solvent comprising 10 to 70% by weight of the ingredient (i), 20 to 80% by weight of the ingredient (ii), and 3 to 10% by weight of the ingredient (iii).

Furthermore, the present invention provides the positive resist composition wherein said ingredient (iii) is benzyl salicylate.

Still further, the present invention provides the positive resist composition wherein said ingredient (A) is a novolak resin.

Yet further, the present invention provides the positive resist composition wherein said ingredient (B) is an ester of naphthoquinone-1,2-diazide-4-sulfonic acid and a phenolic compound, or an ester of naphthoquinone-1,2-diazide-5-sulfonic acid and a phenolic compound.

Further, the present invention provides the positive resist composition wherein said phenolic compound is at least one compound selected from the group consisting of bis(4-hydroxyphenyl)-2-hydroxyphenylmethane, methyl-substituted derivatives thereof, methyl-substituted and cyclohexyl-substituted derivatives of bis(4-hydroxyphenyl)-2-hydroxyphenylmethane, and methyl-substituted and cyclohexyl-substituted derivatives of bis(4-hydroxyphenyl)-3,4-dihydroxyphenylmethane.

Furthermore, the present invention provides the positive resist composition wherein said phenolic compound is bis(3-cyclohexyl-5-methyl-4-hydroxyphenyl)-3,4-dihydroxyphenylmethane.

Still further, the present invention provides the positive resist composition wherein said positive resist composition further contains a benzene compound of 1,3-bis[2-(5-cyclohexyl-2-methyl-4-hydroxyphenyl)-2-propyl]benzene, 1,4-bis[2-(5-cyclohexyl-2-methyl-4-hydroxyphenyl)-2-propyl]benzene, or a mixture thereof.

Yet further, the present invention provides the positive resist composition wherein the content of said benzene compound is 0.2 to 10 parts by weight relative to 100 parts by weight of the ingredient (A).

Further, the present invention provides a method for forming a positive resist pattern comprising:

applying a positive resist composition to a substrate;

drying the applied positive resist composition to form a resist film;

selectively irradiating the resist film with an active light beam; and performing a developing treatment, wherein said positive resist composition comprises:

(A) an alkali-soluble resin;

(B) a quinonediazide-group-containing compound; and (C) an organic solvent which contains (i) 2-heptanone, (ii) ethyl lactate, and (iii) a high-boiling organic solvent having a boiling point of 200 to 350° C.

DETAILED DESCRIPTION OF THE INVENTION

Figure 1:
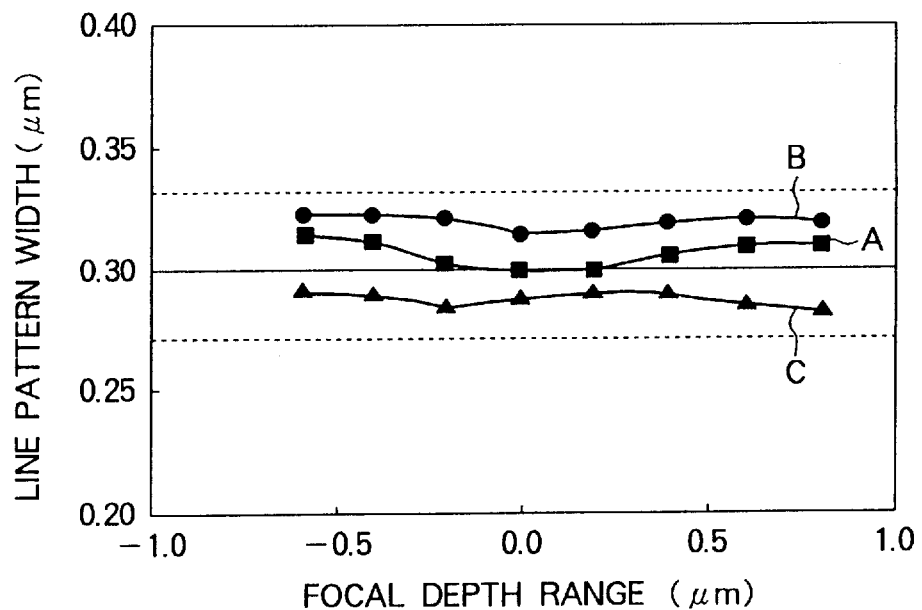
FIG. 1 shows the relationships between the focal depth range and the line pattern width when 0.30 μm width line patterns are formed using the resist composition of the present invention, wherein line A indicates the relationship at the best exposure value, line B indicates the relationship at an exposure value less than the best value, and line C indicates the relationship at an exposure value more than the best value.

Examples of alkali-soluble resins (A) which can be used in the above-described positive resist composition include novolak resins, acrylic resins, copolymer of styrene and acrylic acid, polymer of hydroxystyrene, polyvinyl phenol and poly(α-methylvinyl phenol), and particularly preferred are alkali-soluble novolak resins.

Any alkali-soluble novolak resins conventionally used as coating materials in positive resist compositions can be used in the present invention without any special limitation. Such a novolak resin may be prepared, for example, by condensing at least one aromatic hydroxy compound with at least one aldehyde compound in the presence of an acid catalyst such as hydrochloric acid, sulfuric acid, formic acid or oxalic acid. Examples of aromatic hydroxy compounds include phenol, m-cresol, o-cresol, p-cresol, 2,3-xylenol, 2,5-xylenol, 3,5-xylenol, 3,4-xylenol, m-ethylphenol, o-ethylphenol, p-ethylphenol, 2,3,5-trimethylphenol, 2,3,5-triethylphenol, 4-tert-butylphenol, 3-tert-butylphenol, 2-tert-butylphenol, 2-tert-butyl-4-methylphenol, 2-tert-butyl-5-methylphenol, m-methoxyphenol, o-methoxyphenol, p-methoxyphenol, m-ethoxyphenol, m-propoxyphenol, o-propoxyphenol, p-propoxyphenol, o-isopropenylphenol, p-isopropenylphenol, 2-methyl-4-isopropenylphenol, 2-ethyl-4-isopropenylphenol, phenylphenol, 4,4'-dihydroxybiphenyl, bisphenol A, resorcinol, hydroquinone, and pyrogallol. Meanwhile, examples of aldehyde compounds include formaldehyde, paraformaldehyde, trioxan, acetaldehyde, propionaldehyde, butylaldehyde, trimethylacetaldehyde, acrolein, crotonaldehyde, cyclohexanealdehyde, furfural, furylacrolein, benzaldehyde, terephthalaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-methylbenzaldehyde, m-methylbenzaldehyde, p-methylbenzaldehyde, m-chlorobenzaldehyde, o-chlorobenzaldehyde, p-chlorobenzaldehyde, and cinnamic aldehyde.

The weight average molecular weight of such an alkali-soluble resin should preferably fall within 2,000 to 20,000, and more preferably, 5,000 to 15,000. When the weight average molecular weight is below 2,000, excessive thickness reduction by development occurs. Meanwhile, when it exceeds 20,000, the developing rate becomes low. Incidentally, the weight average molecular weight is measured in terms of polystyrene according to gel permeation chromatography.

The quinonediazide-group-containing compound (B) used as a photosensitive agent in the positive resist composition of the present invention may be prepared, for example, by completely or partially esterifying a sulfonic acid of a quinonediazide compound such as orthobenzoquinonediazide, orthonaphthoquinonediazide and orthoanthraquinonediazide with a compound containing a phenolic hydroxyl group or an amino group. Examples of phenolic hydroxyl group-containing compounds include polyhydroxybenzophenons such as 2,3,4-trihydroxybenzophenone, 2,4,4'-trihydroxybenzophenone, 2,4,6-trihydroxybenzophenone, 2,2',4,4'-tetrahydroxybenzophenone, 2,3,4,4'-tetrahydroxybenzophenone, 2,3',4,4',6-pentahydroxybenzophenone, 2,2',3,4,4'-pentahydroxybenzophenone, 2,2',3,4,5'-pentahydroxybenzophenone, 2,3',4,5,5'-pentahydroxybenzophenone, and 2,3,3',4,4',5'-hexahydroxybenzophenone; hydroxyaryl compounds such as tris(4-hydroxyphenyl)methane, bis(4-hydroxyphenyl)-2-hydroxyphenylmethane, bis(3-cyclohexyl-5-methyl-4-hydroxyphenyl)-3,4-dihydroxyphenylmethane, bis(4-hydroxy-3,5-dimethylphenyl)-4-hydroxyphenylmethane, bis(4-hydroxy-3,5-dimethylphenyl)-3-hydroxyphenylmethane, bis(4-hydroxy-3,5-dimethylphenyl)-2-hydroxyphenylmethane, bis(4-hydroxy-2,5-dimethylphenyl)-4-hydroxyphenylmethane, bis(4-hydroxy-2,5-dimethylphenyl)-3-hydroxyphenylmethane, bis(4-hydroxy-2,5-dimethylphenyl)-2-hydroxyphenylmethane, bis(4-hydroxy-3,5- dimethylphenyl)-3,4-dihydroxyphenylmethane, bis(4-hydroxy-2,5-dimethylphenyl)-3,4-dihydroxyphenylmethane, bis(4-hydroxy-3,5-dimethylphenyl)-2,4-dihydroxyphenylmethane, bis(4-hydroxy-2,5-dimethylphenyl)-2,4-dihydroxyphenylmethane, bis(4-hydroxyphenyl)-3-methoxy-4-hydroxyphenylmethane, bis(3-cyclohexyl-4-hydroxyphenyl)-4-hydroxyphenylmethane, bis(3-cyclohexyl-4-hydroxyphenyl)-3-hydroxyphenylmethane, bis(3-cyclohexyl-4-hydroxyphenyl)-2-hydroxyphenylmethane, bis(3-cyclohexyl-4-hydroxy-6-methylphenyl)-4-hydroxyphenylmethane, bis(3-cyclohexyl-4-hydroxy-6-methylphenyl)-3-hydroxyphenylmethane, bis(3-cyclohexyl-4-hydroxy-6-methylphenyl)-2-hydroxyphenylmethane, bis(3-cyclohexyl-4-hydroxy-6-methylphenyl)-3,4-dihydroxyphenylmethane, bis(3-cyclohexyl-6-hydroxyphenyl)-4-hydroxyphenylmethane, bis(3-cyclohexyl-6-hydroxyphenyl)-3-hydroxyphenylmethane, bis(3-cyclohexyl-6-hydroxyphenyl)-2-hydroxyphenylmethane, bis(3-cyclohexyl-6-hydroxy-4-methylphenyl)-4-hydroxyphenylmethane, bis(3-cyclohexyl-6-hydroxy-4-methylphenyl)-2-hydroxyphenylmethane, bis(3-cyclohexyl-6-hydroxy-4-methylphenyl)-3,4-dihydroxyphenylmethane, 1-[1-(4-hydroxyphenyl)isopropyl]-4-[1,1-bis(4-hydroxyphenyl)ethyl]benzene, and 1-[1-(3-methyl-4-hydroxyphenyl)isopropyl]-4-[1,1-bis(3-methyl-4-hydroxyphenyl)ethyl]benzene; bis(hydroxyphenyl)alkanes such as 2-(2,3,4-trihydroxyphenyl)-2-(2',3',4'-trihydroxyphenyl)propane, 2-(2,4-dihydroxyphenyl)-2-(2',4'-dihydroxyphenyl)propane, 2-(4-hydroxyphenyl)-2-(4'-hydroxyphenyl)propane, bis(2,3,4-trihydroxyphenyl)methane, and bis(2,4-dihydroxyphenyl)methane; and aromatic hydroxy compounds such as phenol, p-methoxyphenol, dimethylphenol, hydroquinone, bisphenol A, naphthol, pyrocatechol, pyrogallol monomethyl ether, pyrogallol 1,3-dimethyl ether, gallic acid, partially esterified gallic acid, and partially etherified gallic acid. Of the quinonediazide-group-containing compounds, especially preferred are completely or partially esterified compounds derived from the above-listed phenolic hydroxyl group-containing compounds and naphthoquinone-1,2-diazide-5-sulfonic acid or naphthoquinone-1,2-diazide-4-sulfonic acid. Among these, the quinonediazide-group-containing compounds having esterification degrees of 70 mol % or higher are more preferred. These quinonediazide-group-containing compounds can be used alone or in combination.

More specifically, the quinonediazide-group-containing compound can be prepared, for example, by condensing a phenolic hydroxyl group-containing compound with a halogenized quinonediazide compound such as naphthoquinone-1,2-diazide-5-sulfonyl chloride or naphthoquinone-1,2-diazide-4-sulfonyl chloride in an appropriate solvent such as dioxane, N-methylpyrrolidone or dimethylacetamide in the presence of an alkali compound such as triethanolamine an alkali carbonate or an alkali hydrogencarbonate, thus achieving complete or partial esterification.

The quinonediazide-group-containing compound is contained in a range of 1 to 40 parts by weight, and preferably, 15 to 30 parts by weight relative to 100 parts by weight of the alkali-soluble resin. When the content of the quinonediazide-group-containing compound is below the above-described range, a resist pattern having a practical sectional shape can rarely obtained. Meanwhile, when it exceeds the above-described range, the photosensitivity of the resulting resist will be lowered.

As described above, the positive resist composition of the present invention comprises (A) an alkali-soluble resin and (B) a quinonediazide-group-containing compound dissolved in a mixture solvent containing (i) 2-heptanone, (ii) ethyl lactate and (iii) a high-boiling organic solvent having a boiling point of 200 to 350° C. Examples of (iii) high-boiling organic solvents having boiling points of 200 to 350° C. include benzyl acetate, isoamyl salicylate, methyl salicylate, benzyl salicylate, diethyl phthalate, dibutyl phthalate, dimethyl phthalate, γ-butyrolactone, ethyl benzoate, butyl benzoate, propyl benzoate, benzyl benzoate, ethylene glycol monophenyl ether, ethylene glycol monohexyl ether, 1,3-octylene glycol, diethylene glycol, diethylene glycol diacetate, diethylene glycol dibutyl ether, diethylene glycol monoethyl ether, diethylene glycol monoethyl ether acetate, diethylene glycol monobutyl ether, diethylene glycol monobutyl ether acetate, dipropylene glycol, dipropylene glycol monobutyl ether, triethylene glycol, triethylene glycol di-2-ethyl butyrate, triethylene glycol dimethyl ether, triethylene glycol monoethyl ether, triethylene glycol monomethyl ether, tripropylene glycol, tripropylene glycol monomethyl ether, 2-ethylhexanoic acid, caprylic acid, caproic acid, catechol, octylphenol, and N-methylpyrrolidone. Each of these organic solvents may be used solely or in combination with the others. Especially preferred are benzyl salicylate, γ-butyrolactone and N-methylpyrrolidone. Among these, benzyl salicylate is most preferably used since it is superior in the effect of reducing sensitivity variation relative to the resist-film thickness, and achieving a resist pattern which has a wide focal-depth range so as to cope with irregularities in the exposure value and exhibits reduced size-deviation from the mask size.

The mixture solvent as ingredient (C) in the positive resist composition of the present invention preferably contains 10 to 70% by weight of ingredient (i), 20 to 80% by weight of ingredient (ii), and 3 to 10% by weight of ingredient (iii). If the content of any ingredient deviates from the above-described range, the object of the present invention cannot be achieved.

As occasion demands, the positive resist composition of the present invention may further contain in addition to the above-described ingredients other ordinarily-used miscible additives such as additional resins for improving the performance of the resulting resist film, plasticizers, stabilizers, sensitizers, coloring agents, and contrast-enhancing agents.

Preferred examples of sensitizers include bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, 1-[1-(4-hydroxyphenyl)isopropyl]-4-[1,1-bis(4-hydroxyphenyl)ethyl]benzene, 1-[1-(3-methyl-4-hydroxyphenyl)isopropyl]-4-[1,1-bis(3-methyl-4-hydroxyphenyl)ethyl]benzene, 4,6-bis[1-(4-hydroxyphenyl)isopropyl]resorcin, 1,3-bis[2-(5-cyclohexyl-2-methyl-4-hydroxyphenyl)-2-propyl]benzene, and 1,4-bis[2-(5-cyclohexyl-2-methyl-4-hydroxyphenyl)-2-propyl]benzene.

The method for forming a resist pattern according to the present invention is characterized by using the above-illustrated positive resist composition in combination with a resist-pattern-forming method used in the field of the ordinary photoresist techniques.

A preferred example of such a method comprises:
preparing a resist solution by dissolving an alkali-soluble resin and a quinonediazide-group-containing compound in a mixture solvent being ingredient (C);
applying the resist solution to a substrate such as a silicon wafer or a glass sheet using an appropriate coating means such as a spinner, and then drying it to form a resist film;

irradiating the resist film with an active light beam such as an ultraviolet ray or a far ultraviolet ray through a mask pattern, or irradiating it with an electron beam in the scanning manner;

developing the irradiated resist film in a developing solution, for example, an alkaline solution such as a solution containing 1 to 10% by weight of tetramethylammonium hydroxide; and washing and drying the resultant to form a resist pattern.

The resist pattern formed according to the above-described method of the present invention exhibits small thickness reduction and superior shape-profiling ability. In particular, it exhibits small thickness reduction even when the pattern width is as fine as 0.35 μm or less, can cope with irregularities in the exposure value since it has a wide focal-depth range, and exhibits reduced size-deviation from the mask size. Due to such advantages, the resist pattern can be effectively used for manufacturing semiconductor devices and liquid-crystal display devices, which have been progressively finely processed.

EXAMPLES

The present invention will be further illustrated in detail with examples.

Incidentally, the examples and comparative examples below were evaluated according to the following methods.

<Sensitivity Variation Relative to Thickness>

The sample positive resist solution was applied to 6-inch silicon wafers using a spinner and dried on a hot plate at 90° C. for 90 sec., wherein the rotating speed of the spinner was altered in order to achieve resist films having thicknesses of 0.7 μm, 1.0 μm, 1.5 μm and 2.0 μm, respectively. Each resist film thus obtained was then irradiated with an active light beam generated from a reductive projection aligner NSR-2005i10D (manufactured by Nikon Corporation). Subsequently, the resultant was developed in an aqueous solution containing 2.38% by weight of tetramethylammonium hydroxide at 23° C. for 60 sec., and dried after washing with water for 30 sec. The exposure time period (ms) required for achieving a width ratio of 1:1 in replicating 0.5 μm width lines and spaces was regarded as the index of sensitivity, and sensitivity variation was evaluated from the respective sensitivities measured at the above-described thicknesses.

<Thickness Reduction>

The sample positive resist solution was applied to a 6-inch silicon wafer and dried on a hot plate at 90° C. for 90 sec. to obtain a resist film having a thickness of 1.0 μM. The resist film was then subjected to exposure using a reductive projection aligner NSR-2005i10D (manufactured by Nikon Corporation) with a standard exposure value of Eop (the exposure value required for forming a 0.35 μm width line pattern) while the focal points was altered. Subsequently, the resultant was developed in an aqueous solution containing 2.38% by weight of tetramethylammonium hydroxide at 23° C. for 60 sec., and dried after washing with water for 30 sec. The 0.35 μm width line resist pattern thus obtained was then observed through a SEM (Scanning Electron Microscopy) photograph. The samples in which thickness reduction to practically unsuitable degree was observed were evaluated as "severe", and the samples in which no thickness reduction or thickness reduction within practically acceptable degree was observed were evaluated as "non or slight".

Example 1

A mixture was prepared by mixing m-cresol and p-cresol in a mole ratio of 4:6. Formalin was then added to this mixture, and condensation was carried out in the presence of an oxalic acid catalyst according to an ordinary method. The cresol-novolak resin thus obtained was subjected to removal of the low molecule fractions to obtain a cresol-novolak resin having a weight average molecular weight of 7,000. Subsequently, 100 parts by weight of this cresol-novolak resin, 30 parts by weight of a quinonediazide-group-containing compound which was prepared by esterifying bis(3-cyclohexyl-4-hydroxy-5-methylphenyl)-3,4-dihydroxyphenylmethane with naphthoquinone-1,2-diazide-5-sulfonyl chloride in a mole ratio of 1:2, and 2 parts by weight of 1,3-bis[2-(5-cyclohexyl-2-methyl-4-hydroxyphenyl)-2-propyl]benzene were dissolved in a mixture solvent comprising 150 parts by weight of 2-heptanone, 130 parts by weight of ethyl lactate and 20 parts by weight of benzyl salicylate to obtain a positive resist solution.

Resist films were formed using the above-obtained positive resist solution, and subjected to exposure and development to obtain positive resist patterns. Each resist pattern was subjected to evaluation of sensitivity variation relative to film thickness, and evaluation of thickness reduction. The results are shown in Table 1. As is obvious from Table 1, the above-formed resist films exhibited small sensitivity variation relative to film thickness, and small film-thickness reduction even when used for forming a fine line pattern having a width of 0.35 μm. Accordingly, the positive resist composition of the present invention can achieve practically useful resist films.

FIG. 1 shows the relationship between focal depth range and the line pattern width observed at the best exposure value for forming a 0.30 μm width line pattern (indicated by line A), at an exposure value less than the best value (indicated by line B), or at an exposure value more than the best value (indicated line C). As is obvious from FIG. 1, the 0.30 μm width line patterns formed using the positive resist composition of the present invention exhibited a wide focal-depth range (acceptable range for deviation from the best focal point), and the actual widths of the line patterns fell within 0.30 μm±10%, namely, the line pattern sizes were less deviated from the mask size.

Comparative Example 1

A positive resist solution was prepared in the same manner as in the aforementioned example except that the mixture solvent comprised 150 parts by weight of 2-heptanone and 150 parts by weight of ethyl lactate. Resist films were formed using the positive resist solution, and subjected to exposure and development to obtain positive resist patterns. Each resist pattern was subjected to evaluation of sensitivity variation relative to film thickness, and evaluation of thickness reduction. The results are shown in Table 1.

Figure 2:
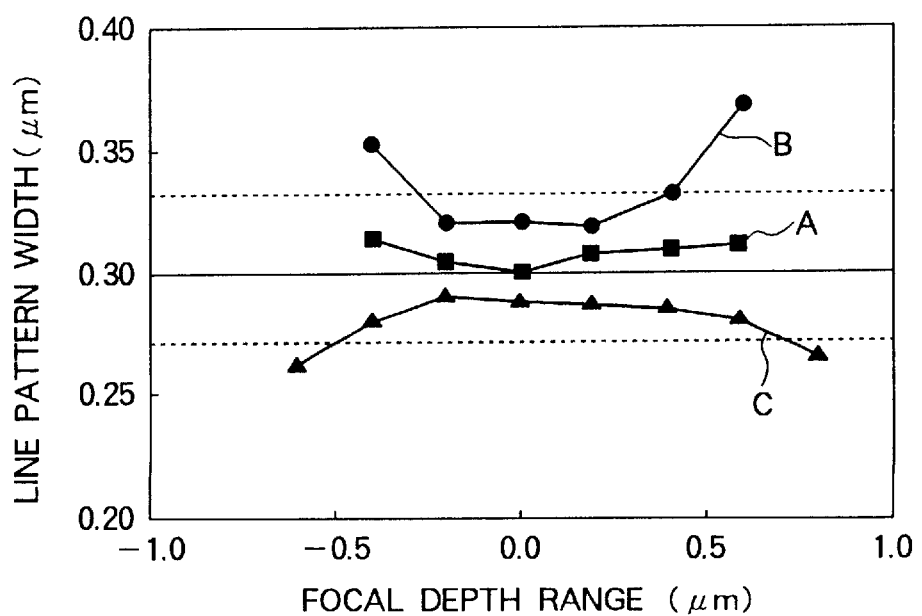
FIG. 2 shows the relationships between the focal depth range and the line pattern width when 0.30 μm width line patterns are formed using a conventional resist composition, wherein the indication by lines A, B or C is similar to FIG. 1.

Further, similar to the aforementioned example, the relationships between focal depth range and the line pattern width were observed at several exposure values in a case where a 0.30 μm width line pattern was formed, and the results are shown in FIG. 2. As is obvious from FIG. 2, in the line patterns formed using the positive resist composition of this comparative example, the actual widths largely varies from 0.30 μm, namely, the line pattern sizes were markedly deviated from the mask size.

TABLE 1

| | Mixture Solvent Ingredient (Parts by Weight) | | | Sensitivity (ms) Film-Thickness (μm) | | | | Thickness Reduction |
|---|---|---|---|---|---|---|---|---|
| | (i) | (ii) | (iii) | 0.7 | 1.0 | 1.5 | 2.0 | |
| Example 1 | H 150 | EL 130 | BS 20 | 370 | 400 | 430 | 480 | Non or Slight |
| Comparative Example 1 | H 150 | EL 150 | — | 370 | 400 | 470 | 550 | Severe |

Notes)

H: 2-heptanone

EL: ethyl lactate

BS: benzyl salicylate

As described above, the positive resist composition of the present invention contains a mixture solvent containing a high-boiling organic solvent having a boiling point of 200 to 350° C., and therefore, it can achieve a resist pattern whose photosensitivity is less variable relative to the thickness, which exhibits small thickness reduction when the pattern width is fine, can cope with irregularities in the exposure value since it has a wide focal-depth range, and exhibits reduced size-deviation from the mask size. Due to such advantageous properties, the positive resist composition of the present invention is highly applicable to manufacture of semiconductor devices or liquid-crystal display devices, the structures of which progressively become finer. Additionally, the positive resist composition of the present invention can be used in ordinary methods for forming resist patterns, and therefore, is highly valuable in industrial fields.

While the invention has been described in detail and with reference to specific embodiments thereof, it will be apparent to one of skill in the art that various changes and modifications can be made therein without departing from the spirit and scope thereof.

We claim:

1. A positive resist composition comprising:

(A) an alkali-soluble resin;

(B) a quinonediazide-group-containing compound; and (C) an organic solvent, wherein said ingredient (C) is a mixture solvent containing:

(i) 2-heptanone;

(ii) ethyl lactate; and (iii) a high-boiling organic solvent having a boiling point of 200 to 350° C.;

wherein said ingredient (iii) is benzyl salicylate.

2. A positive resist composition comprising:

(A) an alkali-soluble resin;

(B) a quinonediazide-group-containing compound; and (C) an organic solvent, wherein said ingredient (C) is a mixture solvent containing:

(i) 2-heptanone;

(ii) ethyl lactate; and (iii) a high-boiling organic solvent having a boiling point of 200 to 350° C.;

wherein said ingredient (C) is a mixture solvent comprising 10 to 70% by weight of the ingredient (i), 20 to 80% by weight of the ingredient (ii), and 3 to 10% by weight of the ingredient (iii); and wherein said ingredient (iii) is benzyl salicylate.

* * * * *